(12) United States Patent
Avoyan et al.

(10) Patent No.: US 6,873,114 B2
(45) Date of Patent: Mar. 29, 2005

(54) METHOD FOR TOOLMATCHING AND TROUBLESHOOTING A PLASMA PROCESSING SYSTEM

(75) Inventors: Armen Avoyan, Glendale, CA (US); Seyed Jafar Jafarian-Tehrani, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/341,913

(22) Filed: Jan. 13, 2003

(65) Prior Publication Data

US 2004/0061448 A1 Apr. 1, 2004

Related U.S. Application Data

(60) Provisional application No. 60/414,108, filed on Sep. 26, 2002.

(51) Int. Cl.[7] .............................. H01J 7/24; H01P 5/08; C23C 14/00
(52) U.S. Cl. ............................. 315/111.71; 315/111.41; 333/17.3; 118/50.1
(58) Field of Search ....................... 315/111.21, 111.71, 315/111.41; 324/464, 459, 693; 333/17.3, 32, 179; 118/50.1, 59.1; 156/345

(56) References Cited

U.S. PATENT DOCUMENTS

| 5,565,737 A | * | 10/1996 | Keane ................... 315/111.21 |
| 5,939,886 A | * | 8/1999 | Turner et al. ............... 324/464 |
| 2003/0178140 A1 | * | 9/2003 | Hanazaki et al. ...... 156/345.28 |

OTHER PUBLICATIONS

SmartPIM with ImPrint—A Better, Faster Way to Fault Detection and Classification (FDC), 2001 Scientific Systems, 4 pages.

* cited by examiner

*Primary Examiner*—Tuyet T. Vo
(74) *Attorney, Agent, or Firm*—Thelen Reid & Priest LLP; Thierry K. Lo

(57) ABSTRACT

A method tests a plasma processing system having a chamber, an RF power source, and a matching network. An RF power signal is generated from the RF power source to the chamber without igniting any plasma within the chamber. The voltage of the RF power signal, the current of the RF power signal, and the phase of the RF power signal, received by the chamber is measured while holding other parameters affecting the chamber constant. A value representative of an impedance of the chamber is computed based on the voltage, the current, and the phase. The value is then compared with a reference value to determine any defects in the plasma processing system. The reference value is representative of the impedance of a defect-free chamber.

18 Claims, 5 Drawing Sheets

US 6,873,114 B2

METHOD FOR TOOLMATCHING AND TROUBLESHOOTING A PLASMA PROCESSING SYSTEM

RELATED APPLICATION

The present application claims the benefit of U.S. Provisional Patent Application Ser. No. 60/414,108, filed Sep. 26, 2002 in the name of inventors Armen Avoyan and Seyed Jafar Jafarian-Tehrani and commonly assigned herewith.

FIELD OF THE INVENTION

The present invention relates to the fabrication of an electronic device. More particularly, the present invention relates to a method and system for verifying a plasma processing system.

BACKGROUND OF THE INVENTION

Various forms of processing with ionized gases, such as plasma etching and reactive ion etching, are increasing in importance particularly in the area of semiconductor device manufacturing. Of particular interest are the devices used in the etching process. Capacitively and inductively coupled plasma etching systems may be used in the processing and fabrication of semiconductor devices. A plasma processing system typically includes a plasma reactor having a plasma chamber therein. An RF power generator supplies RF power to the plasma chamber.

As the principal driving force in plasma formation, the RF frequency and power should be the most carefully controlled parameter. Unfortunately, this is most typically not the case. FIG. 1, for example, shows RF network 10 that produces RF power for an electronic device and fabrication reactor. In particular, for producing RF plasma generation, RF power generator 12 connects to local automated matching network 14 via cable 16. From local automated matching network 14, mechanical RF connection 18 goes to process chamber 20. Process chamber 20 includes cathode 22 that affects process gas 24 within plasma sheath 26 to produce an RF plasma.

In RF network 10, certain limitations exist. For example, RF power generator 12, while including solid state technology, still is a bulky system that consumes an undesirable about of clean room floor space. As a result, performance of RF network 10 is often adversely affected by installation dependencies due to generator placement. The objective of local automated matching network 14 is to provide an efficient transfer of RF power from the RF power generator 12 to the RF load of plasma process gas 24 by matching the widely different impedances between RF power generator 12 and process chamber 20 (the RF load).

A further limitation of RF network 10 relates to process chamber 20 itself. Within process chamber 20, the electronic device, such as a semiconductor wafer, is positioned and processed to achieve some desired result such as etch or deposition. With regard to process chamber 20, two significant limitations exist. First of all, even with known installation dependencies and variability due to the local automated matching network 14, the RF power is primarily controlled based on a measurement made at RF power generator 12. Furthermore, even though RF power generator 12 for a given power level consists of three variables of voltage, current and phase angle, known systems generally measure and control RF power with the unit of watts only.

There may exist many other problems associated with the plasma processing chamber. The plasma processing chamber may not produce the same results after a long usage period because of chamber wear and polymer deposits. Other problems such as improper hardware assembly and inadequate torque requirements may also cause the plasma processing chamber to produce inconsistent yields.

In order to preserve consistent results of the plasma processing chamber, a need exists for a fast and accurate method to verify the correct assembly of the chamber hardware parts and troubleshoot the chamber plasma processing system.

BRIEF DESCRIPTION OF THE INVENTION

A method tests a plasma processing system having a chamber, an RF power source, and a matching network. An RF power signal is generated from the RF power source to the chamber without igniting any plasma within the chamber. The voltage of the RF power signal, the current of the RF power signal, and the phase of the RF power signal, received by the chamber is measured while holding other parameters affecting the chamber constant. A value representative of an impedance of the chamber is computed based on the voltage, the current, and the phase. The value is then compared with a reference value to determine any defects in the plasma processing system. The reference value is representative of the impedance of a defect-free chamber.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1:
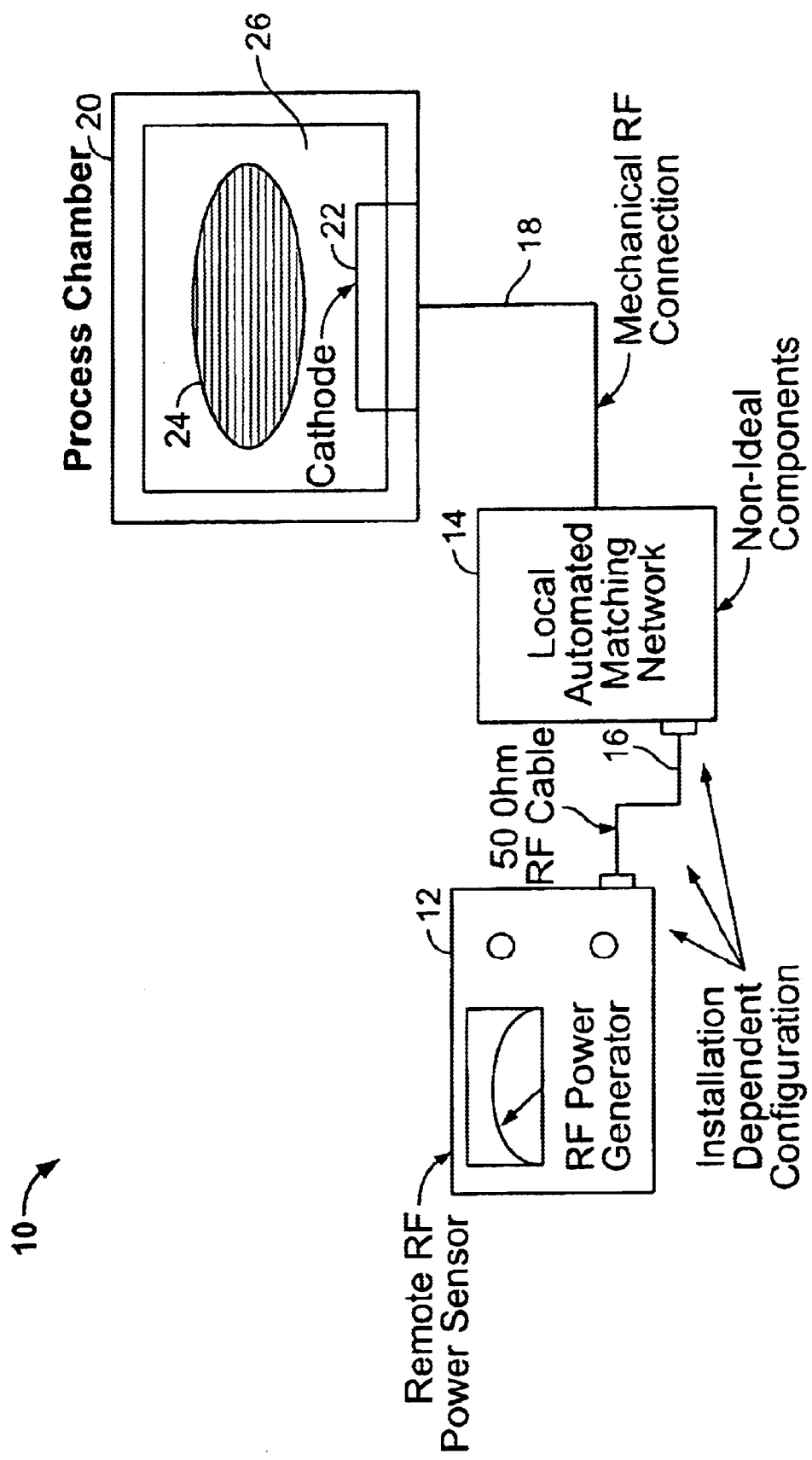
FIG. 1 is a diagram schematically illustrating a conventional RF network for establishing a plasma process environment within a plasma etching device.

Embodiments of the present invention are described herein in the context of a plasma processing system. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application-and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with one embodiment of the present invention, the components, process steps, and/or data structures may be implemented using various types of operating systems (OS), computing platforms, firmware, computer programs, computer languages, and/or general-purpose machines. The method can be run as a programmed process running on processing circuitry. The processing circuitry can take the form of numerous combinations of processors and operating systems, or a stand-alone device. The process can be implemented as instructions executed by such hardware, hardware alone, or any combination thereof. The software may be stored on a program storage device readable by a machine.

In addition, those of ordinary skill in the art will recognize that devices of a less general purpose nature, such as hardwired devices, field programmable logic devices (FPLDs), including field programmable gate arrays (FPGAs) and complex programmable logic devices (CPLDs), application specific integrated circuits (ASICs), or the like, may also be used without departing from the scope and spirit of the inventive concepts disclosed herein.

In accordance with one embodiment of the present invention, the method may be implemented on a data processing computer such as a personal computer, workstation computer, mainframe computer, or high performance server running an OS such as Solaris® available from Sun Microsystems, Inc. of Palo Alto, Calif., Microsoft® Windows® XP and Windows® 2000, available form Microsoft Corporation of Redmond, Wash., or various versions of the Unix operating system such as Linux available from a number of vendors. The method may also be implemented on a multiple-processor system, or in a computing environment including various peripherals such as input devices, output devices, displays, pointing devices, memories, storage devices, media interfaces for transferring data to and from the processor(s), and the like. In addition, such a computer system or computing environment may be networked locally, or over the Internet.

Figure 2:
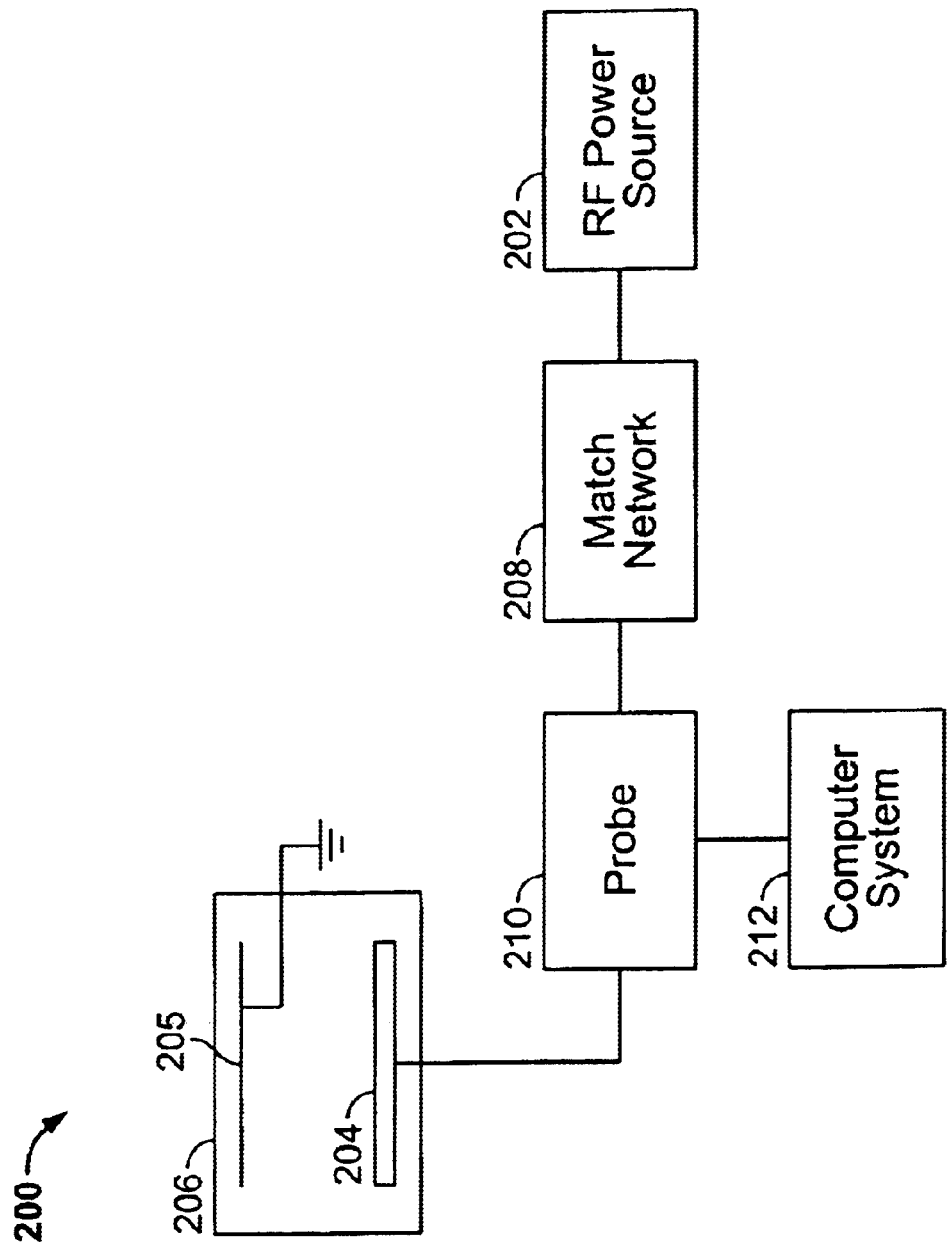
FIG. 2 is a diagram schematically illustrating a system for troubleshooting a plasma processing system in accordance with one embodiment of the present invention.

FIG. 2 is a diagram schematically illustrating a system 200 for verifying a plasma processing system in accordance with one embodiment of the present invention. In the system 200, Radio Frequency (RF) power generator 202 supplies RF power to a bottom electrode 204 disposed within a plasma processing chamber 206. RF current may flow between the bottom electrode 204 and the top grounded electrode 205. In accordance with one embodiment of the present invention, the RF power generator 202 may be a dual frequency generator generating, for example, 2 Mhz and 27 MHz. Those of ordinary skill in the art will appreciate that the above example shown are not intended to be limiting and that other frequencies may be used without departing from the inventive concepts herein disclosed.

A matching network 208 connects the RF power generator 202 to the chamber 206. To provide an efficient transfer of RF power from the RF power generator 202 to the chamber 206 (the RF load), the matching network 208 matches the impedance between the RF power generator 202 and the chamber 206. Those of ordinary skills in the art will recognize that there exist a wide variety of designs for matching network 210, all of which operate by tuning to a minimum reflected power.

A sensor 210 is coupled to the system 200 at the input of the chamber 206, between the chamber 206 and the matching network 208. The sensor 210 measures the voltage, current, and phase angle of the RF power signal received by the chamber 206. In accordance with one embodiment of the present invention, the sensor 210 may be, for example, a Voltage/Current Probe (VI Probe) or a Network Analyzer. Those of ordinary skills in the art will recognize that many varieties of voltage, current, and phase angle sensors may be applied to the present invention.

Figure 3:
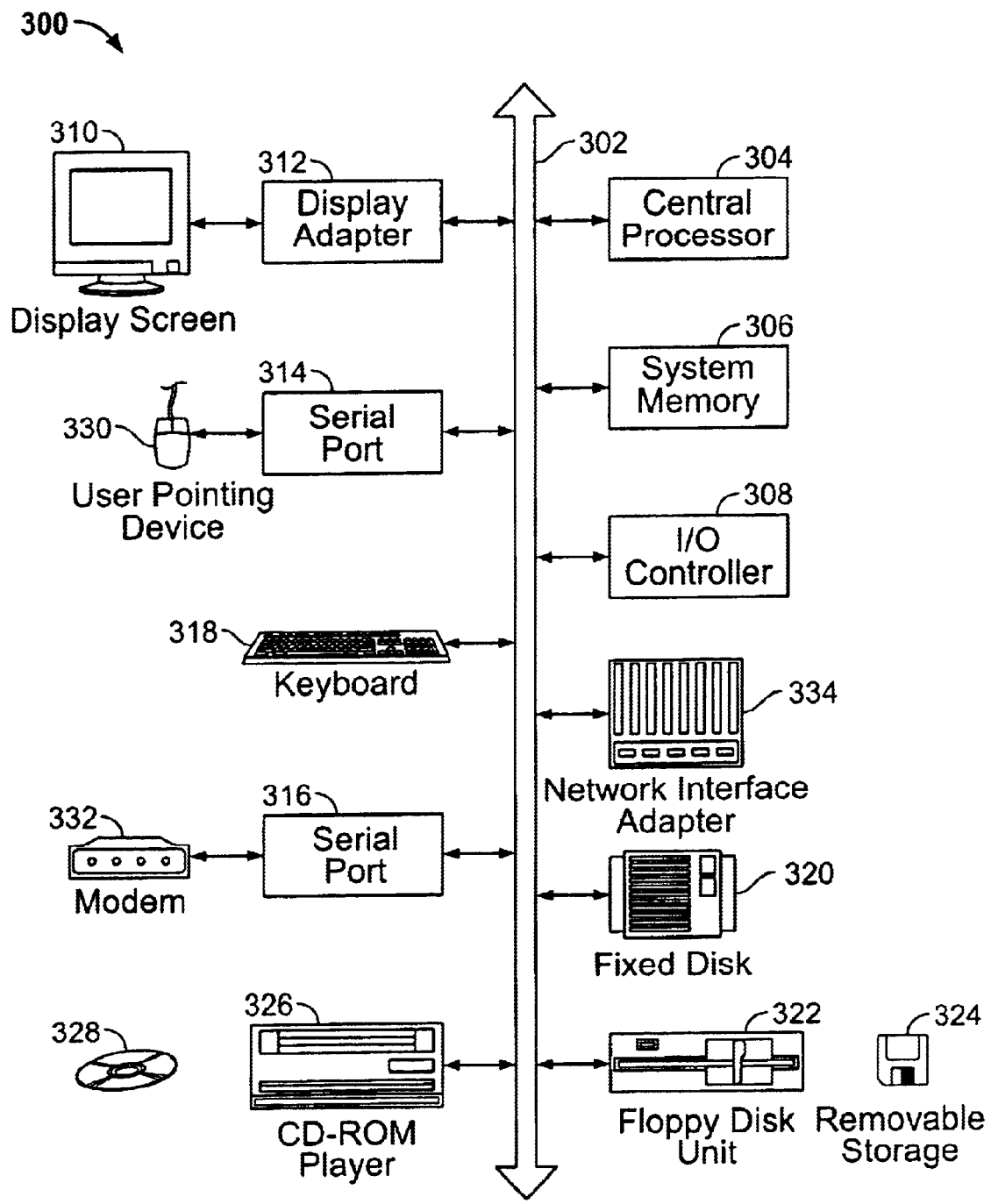
FIG. 3 is a block diagram or a computer system suitable for implementing aspects of the present invention.

A computer system 212 receives the measured data from the sensor 210 (voltage, current, and phase angle). The computer system 212 allows a user to verify whether the plasma processing system is free of any defects and whether the chamber hardware parts are assembled correctly by analyzing the received data. The algorithm within the computer system 212 is further discussed below the flow diagram of FIG. 4. FIG. 3 depicts a block diagram of a computer system 300 suitable for implementing aspects of the present invention. As shown in FIG. 3, computer system 300 includes a bus 302 which interconnects major subsystems such as a central processor 304, a system memory 306 (typically RAM), an input/output (I/O) controller 308, an external device such as a display screen 310 via display adapter 312, serial ports 314 and 316, a keyboard 318, a fixed disk drive 320, a floppy disk drive 322 operative to receive a floppy disk 324, and a CD-ROM player 326 operative to receive a CD-ROM 328. The system memory 306 may contain the algorithm described in FIG. 4. Many other devices can be connected, such as a pointing device 330 (e.g., a mouse) connected via serial port 314 and a modem 332 connected via serial port 316. Modem 332 may provide a direct connection to a remote server via a telephone link or to the Internet via a POP (point of presence). Alternatively, a network interface adapter 334 may be used to interface to a local or wide area network using any network interface system known to those skilled in the art (e.g., Ethernet, xDSL, AppleTalk™).

Many other devices or subsystems (not shown) may be connected in a similar manner. Also, it is not necessary for all of the devices shown in FIG. 3 to be present to practice the present invention, as discussed below. Furthermore, the devices and subsystems may be interconnected in different ways from that shown in FIG. 3. The operation of a computer system such as that shown in FIG. 3 is readily known in the art and is not discussed in detail in this application, so as not to overcomplicate the present discussion. Code to implement the present invention may be operably disposed in system memory 306 or stored on storage media such as fixed disk 320, floppy disk 324 or CD-ROM 328.

Figure 4:
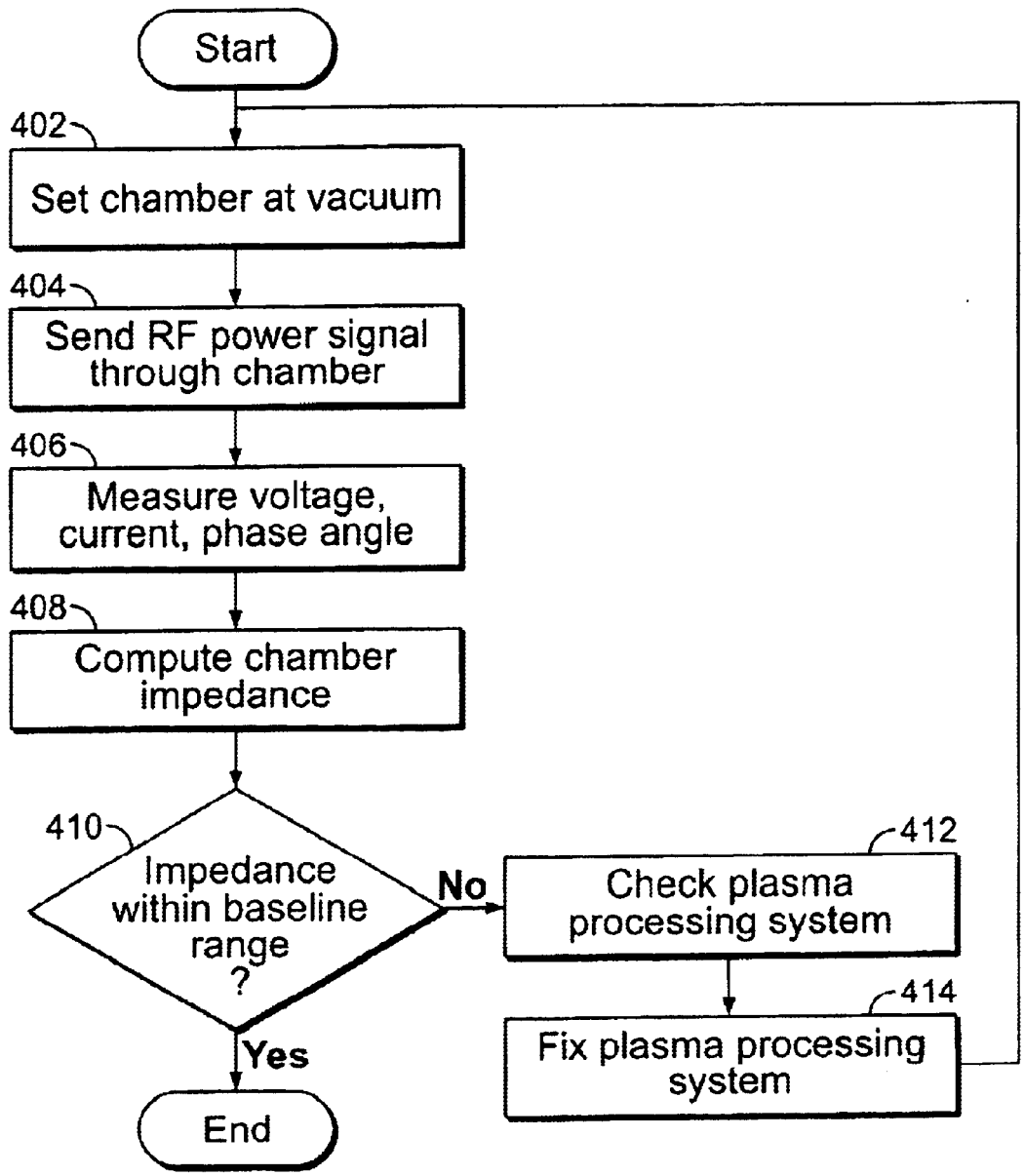
FIG. 4 is a flow diagram schematically illustrating a method for troubleshooting a plasma processing system in accordance with one embodiment of the present invention.

FIG. 4 is a flow diagram schematically illustrating a method for troubleshooting a plasma processing system in accordance with one embodiment of the present invention. Beginning at 402, a vacuum is created in the chamber 206 with a pressure of about 0 mTorr. The chamber 206 may be a "clean" chamber without any wafer to be processed or gasses flowing. At 404, an RF power signal is being generated in the chamber with no gasses flowing. For example, a low power, such as about 10 Watts or less, at 2 Mhz or 27 Mhz may be generated through the chamber 206 without igniting any plasma. At 406, sensor 210 measures the voltage, current, and phase angle of the RF power signal received at the plasma-less chamber 206. At 408, the computer system 212 receives and records the measured voltage, current, and phase angle of the RF power signal. The computer system 212 computes the chamber impedance from the measured data.

Those of ordinary skills in the art will recognize that the impedance of the chamber is a complex quantity related to the interaction between the AC current from the RF power generator 202 (forward power) and resistance and reactance (chamber parts). The following equations illustrates the above relationship:

$$Z=R+jX \qquad \text{Equation 1}$$

$$R=|Z|\cos\theta \qquad \text{Equation 2}$$

$$X=|Z|\sin\theta \qquad \text{Equation 3}$$

$$|Z|=V/I$$

Where Z is the impedance of the chamber, R is the resistance, X is the reactance, θ is the phase angle, V is the measured voltage, and I is the measured current.

The chamber impedance may be affected by many factors such as: the gas pressure, the gas type, the RF power, the wall conditions, the gas pressure, the RF grounding, the wafer type, the wafer placement, and the power coupling. Thus, if any changes occur in the RF load, such as the polymerization of the chamber wall or the wearing away of anodization coatings on various process chamber components, the voltage and current will change, and thus the impedance of the chamber.

Because the chamber 206 is set at vacuum, the phase angle θ of the RF power signal through the vacuum chamber is about 90°. Because the phase angle θ is about 90°, the resistance R is about zero. Thus, the impedance of the chamber is mostly reactance. The computed value may be representative of the absolute value of the impedance.

At 410, the computer system compares the computed chamber impedance with an impedance baseline to determine whether any defects exist. The impedance baseline is the mean impedance of plasma processing chambers of the same type in a vacuum at the time of manufacturing. For illustration purposes, the mean impedance of a plasma-less chamber may be, for example, 15Ω. If the measured impedance of a plasma-less chamber of the same type is off by more than at least about 10% of 15Ω, for example, 19Ω, possible defects may exist. In that case, at 412, the chamber needs to be checked for deficiencies. Potential defects may include but are not limited to the following: improper hardware assembly, inadequate torque requirements, substandard parts used, missing hardware parts, chamber wear and arcing, polymer deposits. After identifying and fixing the potential problem at 414, the troubleshooting process may be reiterated at 402 to verify the system.

Figure 5:
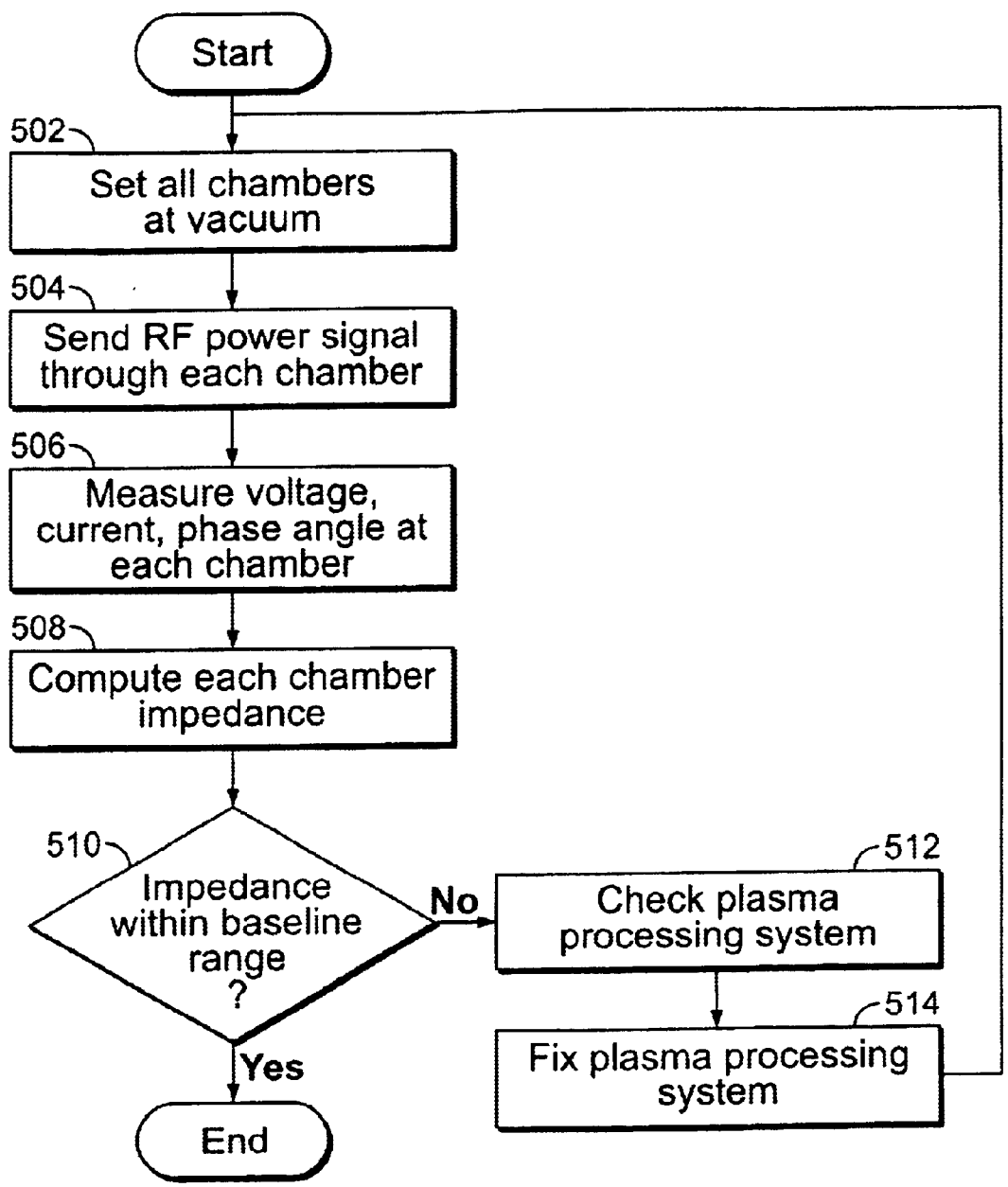
FIG. 5 is a flow diagram schematically illustrating a method for toolmatching a plasma processing system in accordance with one embodiment of the present invention.
Figure 6:
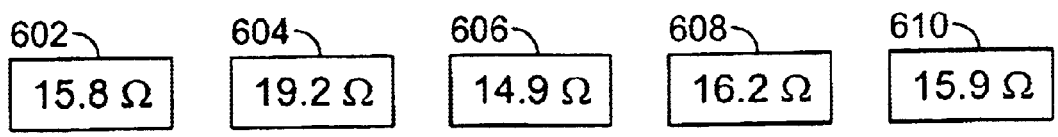
FIG. 6 is a block diagram schematically illustrating several chambers with their respective measured impedance in accordance with one embodiment of the present invention.

Toolmatching may be necessary to ensure that all plasma chambers produced are free of defects. One may be able to identify any defective plasma chamber by comparing the chamber impedance of all processing chambers of the same model, type, or design. FIG. 5 is a flow diagram schematically illustrating a method for toolmatching a plasma processing system in accordance with one embodiment of the present invention. Beginning at 502, a vacuum is created in each chamber 206 with a pressure of, for example, about 0 mTorr. Each chamber 206 may be a "clean" chamber without any wafer to be processed or gasses flowing. At 504, a RF power signal is being generated in each chamber with no gasses flowing through each chamber, and thus no plasma. For example, a low power, such as about 10 Watts or less, at 2 Mhz or 27 Mhz, may be generated through each chamber 206 without igniting any plasma. At 506, each chamber sensor 210 measures the voltage, current, and phase angle of the RF power signal received at each plasma-less chamber 206. At 508, each chamber computer system 212 receives and records the measured voltage, current, and phase angle of the RF power signal. Each chamber computer system 212 computes the chamber impedance from the measured data.

Because the chamber 206 is set at a vacuum, the phase angle θ of the RF power signal through the vacuum chamber is about 90°. Because the phase angle θ is about 90°, the resistance R is about zero. Thus, the impedance of the chamber is mostly reactance. The computed value may be representative of the absolute value of the impedance.

At 510, the computer system compares the impedance of each chamber to determine whether any defects exist. For illustration purposes, the computed impedance of several chambers 602, 604, 606, 608, and 610 of the same type without any plasma with an RF power signal of 27 Mhz may be respectively 15.8Ω, 19.2Ω, 14.9Ω, 16.2Ω, 15.9Ω. If the computed impedance of a chamber is off by more than at least about 10% of the median computed impedance, possible defects may exist. In the above illustration, the chamber 604 with a computed impedance of 19.2Ω needs to be checked for possible defects. In that case, at 512, the above chamber needs to be checked for possible deficiencies. Potential defects may include but are not limited to the following: improper hardware assembly, inadequate torque requirements, substandard parts used, missing hardware parts, chamber wear and arcing, polymer deposits. After identifying and fixing the potential problem at 514, the toolmatching process may be reiterated at 502 to verify that all chambers are free of defects.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for testing a plasma processing system having a chamber, an RF power source, and a matching network, the method comprising:

generating an RF power signal at a predetermined constant plasma operating frequency from the RF power source to the chamber without igniting any plasma within the chamber;

measuring a voltage of said RF power signal, a current of said RF power signal, and a phase of said RF power signal, received by the chamber;

computing a value representative of an impedance of the chamber based on said voltage, said current, and said phase; and comparing said value with a reference value to determine any defects in the plasma processing system, said reference value representative of the impedance of a defect-free chamber.

2. The method of claim 1 wherein said RF power signal includes a high frequency power.

3. The method of claim 1 wherein said RF power signal includes a low frequency power.

4. The method of claim 1 wherein said generating further comprises:

matching the impedance of said RF power signal with the impedance of the chamber.

5. A method for testing a plasma processing system having a chamber, an RF power source, and a matching network, the method comprising:
generating an RF power signal from the RF power source to the chamber without igniting any plasma within the chamber;
measuring a voltage of said RF power signal, a current of said RF power signal, and a phase of said RF power signal, received by the chamber;
computing a value representative of an impedance of the chamber based on said voltage, said current, and said phase;
comparing said value with a reference value to determine any defects in the plasma processing system, said reference value representative of the impedance of a defect-free chamber; and
inspecting the plasma processing system when said value is not within at least about 10% of said reference value.

6. A method for toolmatching a plurality of plasma processing chambers, the method comprising:
generating a RF power signal at a predetermined constant plasma operating frequency for each chamber without igniting any plasma within each chamber;
measuring a voltage of said RF power signal, a current of said RF power signal, and a phase of said RF power signal, received by each chamber;
computing a value representative of an impedance for each chamber based on said voltage, said current, and said phase; and
comparing said value for each chamber with other chambers.

7. The method of claim 6 wherein said power includes a high frequency power.

8. The method of claim 6 wherein said power includes a low frequency power.

9. The method of claim 6 wherein said generating further comprises:
matching the impedance of said RF power signal with said impedance of each chamber.

10. A method for toolmatching a plurality of plasma processing chambers, the method comprising:
generating a RF cower signal for each chamber without igniting any plasma within each chamber;
measuring a voltage of said RF cower signal, a current of said RF power signal, and a phase of said RF power signal, received by each chamber while holding other parameters affecting the chamber constant;
computing a value representative of an impedance for each chamber based on said voltage, said current, and said phase;
comparing said value for each chamber with other chambers; and
isolating a plasma processing chamber when a value of a chamber is off by at least about 10% from the mean value of the other chambers.

11. An apparatus for testing a plasma processing system having a plasmaless chamber, an RF power source generating an RF power signal at a predetermined constant plasma operating frequency, and a matching network, the apparatus comprising:
a sensor coupled to the plasmaless chamber, said sensor measuring a voltage, a current, and a phase angle of the RF power signal received at the plasmaless chamber; and
a computer system coupled to said sensor, said computer system computing a value representative of an impedance of the chamber based on said voltage, said current, and said phase, and comparing said value with a reference value to determine any defects in the plasma processing system, said reference value representative of the impedance of a defect-free chamber.

12. The apparatus of claim 11 wherein said RF power signal includes a high frequency power.

13. The apparatus of claim 11 wherein said RF power signal includes a low frequency power.

14. An apparatus for testing a plasma processing system having a plasmaless chamber, an RF power source generating an RF power signal, and a matching network, the apparatus comprising:
a sensor coupled to the plasmaless chamber, said sensor measuring a voltage, a current, and a phase angle of the RF power signal received at the plasmaless chamber;
a computer system coupled to said sensor, said computer system computing a value representative of an impedance of the chamber based on said voltage, said current, and said phase, and comparing said value with a reference value to determine any defects in the plasma processing system, said reference value representative of the impedance of a defect-free chamber; and
wherein said computer system issues a warning when said value is not within at least about 10% of said reference value.

15. An apparatus for testing a plasma processing system having a chamber, an RF power source, and a matching network, the apparatus comprising:
means for generating an RF power signal at a predetermined constant plasma operating frequency from the RF power source to the chamber without igniting any plasma within the chamber;
means for measuring a voltage of said RF power signal, a current of said RF power signal, and a phase of said RF power signal, received by the chamber;
means for computing a value representative of an impedance of the chamber based on said voltage, said current, and said phase; and
means for comparing said value with a reference value to determine any defects in the plasma processing system, said reference value representative of the impedance of a defect-free chamber.

16. An apparatus for toolmatching a plurality of plasma processing chambers, the apparatus comprising:
means for generating a RF power signal at a predetermined constant plasma operating frequency for each chamber without igniting any plasma within each chamber;
means for measuring a voltage of said RF power signal, a current of said RF power signal, and a phase of said RF power signal, received by each chamber;
means for computing a value representative of an impedance for each chamber based on said voltage, said current, and said phase; and
means for comparing said value for each chamber with other chambers.

17. A program storage device readable by a machine, tangibly embodying a program of instructions executable by the machine to perform a method for testing a plasma processing system having a chamber, an RF power source, and a matching network, the method comprising:
generating an RF power signal at a predetermined constant plasma operating frequency from the RF power source to the chamber without igniting any plasma within the chamber;

measuring a voltage of said RF power signal, a current of said RF power signal, and a phase of said RF power signal, received by the chamber;

computing a value representative of an impedance of the chamber based on said voltage, said current, and said phase; and comparing said value with a reference value to determine any defects in the plasma processing system, said reference value representative of the impedance of a defect-free chamber.

18. A program storage device readable by a machine, tangibly embodying a program of instructions executable by the machine to perform a method for toolmatching a plurality of plasma processing chambers, the method comprising:

generating a RF power signal at a predetermined constant plasma operating frequency for each chamber without igniting any plasma within each chamber;

measuring a voltage of said RF power signal, a current of said RF power signal, and a phase of said RF power signal, received by each chamber;

computing a value representative of an impedance for each chamber based on said voltage, said current, and said phase; and comparing said value for each chamber with other chambers.

* * * * *

UNITED STATES PATENT AND TRADEMARK OFFICE
CERTIFICATE OF CORRECTION

PATENT NO. : 6,873,114 B2
DATED : March 29, 2005
INVENTOR(S) : Avoyan et al.

It is certified that error appears in the above-identified patent and that said Letters Patent is hereby corrected as shown below:

Title page,
Item [56], References Cited, U.S. PATENT DOCUMENTS, insert
-- 2004/0135590 A1  *  7/2004 Quon  324/713
   2003/0127188 A1     7/2003 Matsumoto et al.  156/345.1
   5,889,252 A         3/1999 Williams et al.   219/121.54 --.
FOREIGN PATENT DOCUMENTS, insert
-- EP  0939428    2/1999
   JP  2000269195 9/2000 --.
OTHER PUBLICATIONS, insert
-- International Search Report, PCT/US03/30426, dated May 28, 2004 --.

Column 2,
Line 40, after "diagram", replace "or" with -- of --.

Signed and Sealed this

Eleventh Day of October, 2005

JON W. DUDAS
*Director of the United States Patent and Trademark Office*